United States Patent [19]
Yasuhara et al.

[11] Patent Number: 4,989,068
[45] Date of Patent: Jan. 29, 1991

[54] SEMICONDUCTOR DEVICE AND METHOD OF MANUFACTURING THE SAME

[75] Inventors: Toshihiro Yasuhara, Kokubunji; Masachika Masuda, Kodaira; Gen Murakami, Machida, all of Japan

[73] Assignee: Hitachi, Ltd., Tokyo, Japan

[21] Appl. No.: 306,398

[22] Filed: Feb. 6, 1989

[30] Foreign Application Priority Data

Feb. 12, 1988 [JP] Japan .................. 63-30111

[51] Int. Cl.[5] ............... H01L 23/52; H01L 23/48; H01L 23/28
[52] U.S. Cl. ............................ 357/72; 357/70; 357/80
[58] Field of Search .................. 357/70, 72

[56] References Cited

U.S. PATENT DOCUMENTS

| | | | |
|---|---|---|---|
| 4,595,945 | 6/1986 | Graver | 357/72 |
| 4,763,188 | 8/1988 | Johnson | 357/70 |
| 4,862,245 | 8/1989 | Pashtay | 357/72 |

FOREIGN PATENT DOCUMENTS

| | | | |
|---|---|---|---|
| 108502 | 5/1984 | European Pat. Off. . | |
| 0041760 | 3/1980 | Japan | 357/72 |
| 167454 | 8/1985 | Japan . | |
| 0258458 | 11/1986 | Japan | 357/72 |
| 0134944 | 6/1987 | Japan | 357/74 |
| 0154769 | 7/1987 | Japan . | |
| 0198194 | 10/1986 | United Kingdom | 357/72 |

Primary Examiner—Andrew J. James
Assistant Examiner—Viet Q. Nguyen
Attorney, Agent, or Firm—Antonelli, Terry, Stout & Kraus

[57] ABSTRACT

A semiconductor device having a structure in which an insulating resin film or sheet is stuck on the principal surface of a semiconductor chip which is formed with circuits and in which the inner lead portions of a lead frame are arranged on the principal surface of the semiconductor chip through the insulating sheet, is provided in order that the semiconductor chip having the highest possible density of integration may be received placed in a standardized package. The present invention particularly features the shape of the lead frame, according to which the inner lead portions lying within a sealing member are substantially entirely arrayed over the semiconductor chip itself. The fore or front ends of the inner lead portions and the external terminals are located near the shorter lateral sides thereof on the semiconductor chip and the corresponding electrical connections therebetween are along the shorter sides of the semiconductor chip by pieces of bonding wire connecting respective front ends of inner lead portions with corresponding external terminals.

45 Claims, 5 Drawing Sheets

SEMICONDUCTOR DEVICE AND METHOD OF MANUFACTURING THE SAME

BACKGROUND OF THE INVENTION

The present invention relates to a resin-encapsulated semiconductor device, and more particularly to techniques which are effective when applied to technology for packaging a large-sized semiconductor chip.

In a resin-encapsulated semiconductor device, as the size of a semiconductor chip becomes larger, the spacing between the side of a package and the tab thereof being a portion for mounting the semiconductor chip tends to narrow more. This is ascribable to the fact that, in spite of the enlargement of the size of the semiconductor chip (pellet), the size of the package for receiving the semiconductor chip is standardized and cannot be enlarged.

Especially in a conventional semiconductor integrated circuit device of the memory type, a dual in-line type resin-sealing package having a bent width of 300 mils (7.62 mm) is used.

With rise in the density of integration, the memory type semiconductor integrated circuit device has had its semiconductor chip enlarged in the lengthwise direction thereof. In addition, the memory type semiconductor integrated circuit device has the feature that bonding pads in the semiconductor chip are chiefly arranged along both of the shorter sides of the semiconductor chip which is formed in an elongated or rectangular shape.

Accordingly, there is the problem that, when the density of integration in the memory type semiconductor integrated circuit device is increased, it becomes very difficult to maintained a bent width of 300 mils in the dual in-line type resin-sealing package. The reason is that, when the semiconductor chip which is enlarged and elongated and in which the bonding pads thereof are chiefly arranged along the shorter sides is to be placed in the dual in-line type resin-sealing package whose lateral width (i.e. shorter sides) is limited, a the wiring space available for inner leads in the package becomes insufficient.

It is therefore desired to provide a semiconductor device comprising a resin-sealing package which can hold the wiring space required of inner leads adequately even in the case of encapsulating the enlarged and elongated rectangular shaped semiconductor chip that has the bonding pads arranged chiefly along the laterally shorter sides thereof.

In order to comply with such a desire, a semiconductor device stated below has been proposed:

The semiconductor device comprises a semiconductor chip, a plurality of leads which construct external terminals in a manner to be electrically independent of one another, pieces of bonding wire which bridge the respective leads and said semiconductor chip, and a package which seals said semiconductor chip, said leads and the bonding wire pieces with a resin; wherein inner portions (hereinbelow, also termed "inner leads") of, at least, some of said leads are laid under said semiconductor chip within said package, and an insulator layer is interposed between said inner leads and said semiconductor chip.

According to this semiconductor device, the inner leads of, at least, some of the leads are partly laid under the semiconductor chip within the resin-sealing package, so that a wiring space which is made available, for the inner leads can be sufficient. Accordingly, the inner leads can be satisfactorily wired in the package even in the case where, by way of example, an enlarged and elongated semiconductor chip which has its bonding pads arranged chiefly along the shorter lateral sides thereof is to be placed in the dual in-line type resin-sealing package whose lateral width is limited.

Moreover, since the insulator layer is interposed between the semiconductor chip and the inner leads laid thereunder, the insulation between the semiconductor chip and the leads is adequately maintained, and the semiconductor chip can be firmly fixed within the resin-sealing package.

Incidentally, such semiconductor devices are explained in, for example, the official gazettes of Japanese Patent Applications Laid-open No. 114261/1982, No. 218139/1986 and No. 258458/1986.

SUMMARY OF THE INVENTION

Regarding the semiconductor device stated above wherein the semiconductor chip is placed on the inner leads of some leads, it has been revealed that the operation of wire bonding with the fore ends of the inner leads protruding beyond the shorter lateral sides of the semiconductor chip requires lead keeping allowances apart from the fore end parts of the inner leads in order to avoid the dispersion of the leads and to prevent an ultrasonic wave from missing in the wire bonding operation. That is, when the lead keeping allowances are not formed, the wire pieces become poorly bonded at the fore ends of the inner leads, which can result in a short-circuiting.

Further, unless the fore ends of the inner leads are sufficiently drawn out from under the shorter lateral sides of the semiconductor chip, the wire pieces sag and result in a short-circuit contact with the semiconductor chip at the step of connecting the bonding pads (external terminals) and the leads.

These problems have made it impossible to enlarge the size of the semiconductor chip sufficiently.

Meanwhile, when it is intended to apply the semiconductor chip to different packages in common, there is the problem that the wire pieces may cross which could cause a short-circuit on account of a different pad arrangement. This has necessitated to prepare semiconductor chips separately.

Still further, chip coating has been required for preventing soft errors ascribable to alpha particles.

An object of the present invention is to provide a semiconductor device of higher packaging density without altering a package size.

Another object of the present invention is to provide a package wherein the chip occupation rate of which is greater.

Another object of the present invention is to provide a semiconductor device which efficiently prevents soft errors ascribable to alpha particles.

Another object of the present invention is to provide a semiconductor device of high packaging density and high reliability in which a chip of large capacity is mounted in a conventional package.

Another object of the present invention is to provide a technique according to which the inner leads of a lead frame, which does not have tabs, and pads on a semiconductor chip can be disposed on and electrically connected on the principal surface of the semiconductor chip by pieces of bonding wire.

Another object of the present invention is to provide a technique according to which a semiconductor chip can be applied to different packages in common.

The above and other objects and novel features of the present invention will become apparent from the description of this specification and the accompanying drawings.

Typical aspects of performance of the present invention are briefly summarized as follows:

In a resin-encapsulated semiconductor device, an insulator film capable of checking alpha particles is disposed on the principal surface of a semiconductor chip in which bonding pads (external terminals) are mainly arranged along the shorter lateral sides thereof. The corresponding inner leads of the leads of a lead frame, which does not have tabs, have fore end parts which are extended in length and directioned toward positions near the bonding pads associated therewith are arranged on the semiconductor chip through the insulator film, and that the inner leads and the bonding pads are electrically connected by pieces of bonding wire. Further, the leads have all the inner lead portions thereof arranged on the principal surface of the semiconductor chip, and the operation of wire bonding is entirely performed on the chip.

Further, through holes are provided in the desired positions of the insulator film, and the corresponding parts are used as pads for taking out electrodes and are electrically connected by pieces of bonding wire with the fore end parts of the inner lead portions extended round on the semiconductor chip, i.e. extended in length and shaped so that in one direction a respective inner lead portion is directed toward a corresponding pad and in the opposite direction the inner lead portion is directed toward a corresponding location of a longer side of the oblong or rectangular shaped semiconductor chip where it is extended as an outer lead portion which is contiguous with the inner lead portion and which has a greater relative width than that of the inner lead portion.

Further, the loop heights of the bonding wire pieces are adjusted on some of the bonding pads, whereby the bonding wire pieces are crossed and thereby avoid contact therebetween.

In a further aspect of performance, a semiconductor device comprises:

an oblong (elongated rectangular shaped) semiconductor chip whose principal surface is formed with circuits having various functions, and in which external terminals (bonding pads) for deriving signals of said circuits are arranged on both of the shorter lateral sides thereof;

a rectangular sheet which is made of an insulating filmy resin and which is mounted on the principal surface of said semiconductor chip through an adhesive;

leads each of which is made up of an inner lead portion and an outer lead portion, and which are brought from the longer lateral sides of said oblong or elongated rectangular shaped semiconductor chip onto said sheet and are extended round from the longer lateral sides of said semiconductor chip toward the shorter lateral sides thereof so that fore ends of said inner lead portions may be arranged at positions near a corresponding shorter lateral sides of said rectangular sheet;

pieces of metallic fine wire which electrically connect said external terminals and the fore ends of said inner lead portions; and a sealing member which encapsulates therein said semiconductor chip, the insulating filmy resin sheet, said inner lead portions, the metallic fine wire pieces and said external terminals.

According to the present invention as stated above, the inner leads are associated with a lead frame which does not have tabs and that the inner leads of the lead frame are arranged on the principal surface of the semiconductor chip, whereby the leads can be utilized as a wiring layer, so that the wire bonding to the inner leads can be carried out from the desired positions of the semiconductor chip. By way of example, when the insulator film is used as the inter-layer insulator sheet and is provided with the through holes (contacts), as stated above, by deeming the leads to be the wiring layer, wiring leads can be applied from any location.

In addition, as a result of the wire bonding taking place on the principal surface of the semiconductor chip, attention is required with respect to only the prevention of short-circuiting between the bonding wire pieces because the insulator film and the inner leads pose no problem even when contact is present exist on the principal surface of the semiconductor chip. Therefore, the short-circuiting (area shorting) between the end part of the semiconductor chip and the wire piece can be basically eliminated. Accordingly, cross wire bonding is also permitted by adjusting only the relative loop heights of the wire pieces, and different packages such as a small out-line J-bend (hereinbelow, termed "SOJ") and a zigzag in-line package ("ZIP") to which different semiconductor chips have been inevitably applied can also be manufactured using a common semiconductor chip and by performing the cross wire bonding.

Furthermore, the bonding wire pieces can be made low and short and can also be readily bonded in a substantially parallel direction with that of the flowing direction of a sealing resin in the encapsulating operation thereof, so that the propensity deformations of the bonding wire pieces can be lowered.

Furthermore, all the inner leads lie on the upper surface of the semiconductor chip. That is, the fore ends of the inner leads or any other lead parts do not surround the periphery of the semiconductor chip, so that the size of the chip can be satisfactorily enlarged.

DESCRIPTION OF THE PREFERRED EMBODIMENTS

Now, the present invention will be specifically described in conjunction with an embodiment thereof.

Figure 1:
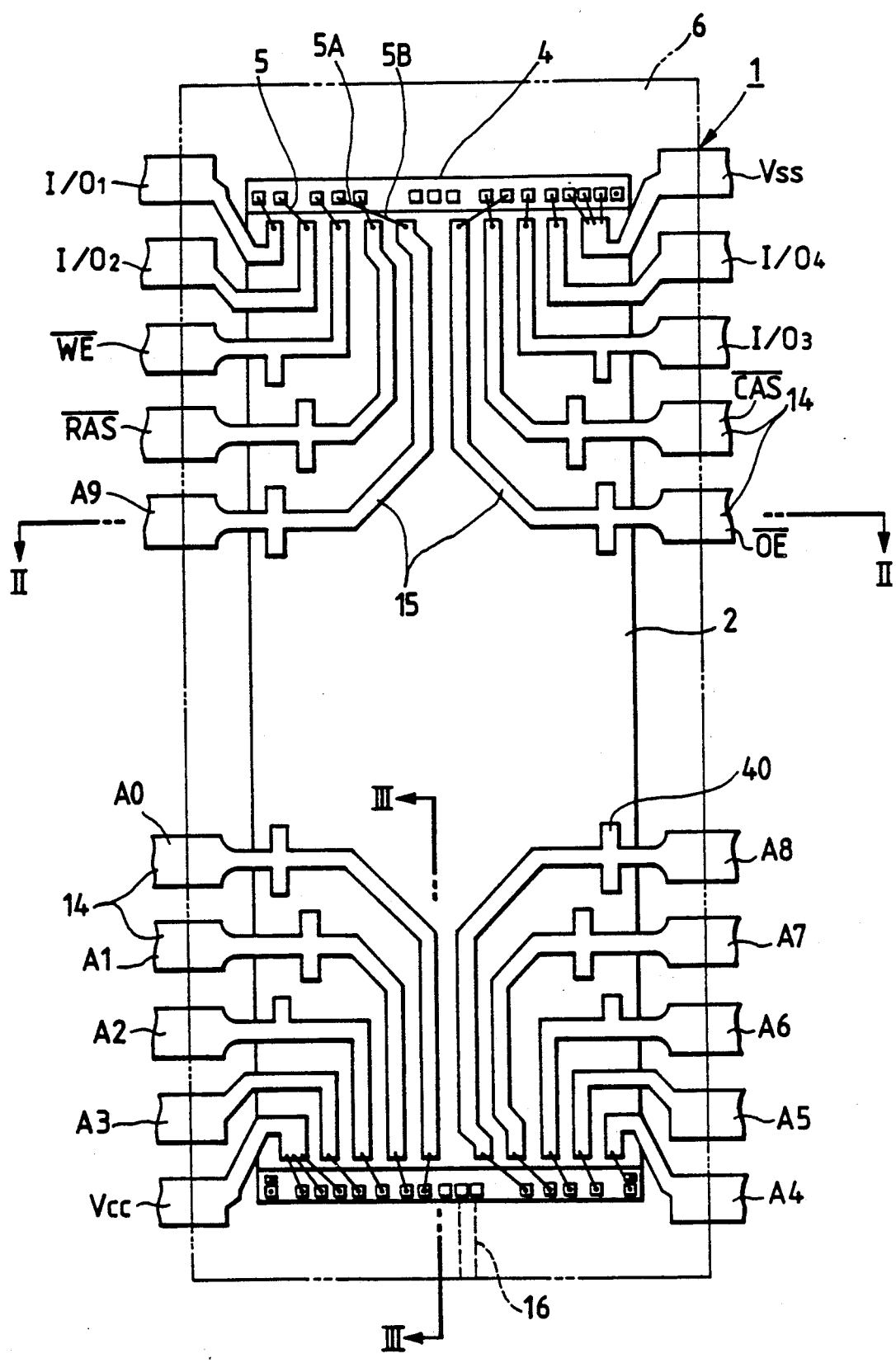
FIG. 1 is a plan view for explaining the structure of the interior of the package of a resin-encapsulated semiconductor device in an embodiment in which the present invention is applied to a 4-megabit dynamic random access memory (4MDRAM) with the SOJ type package.
Figure 2:
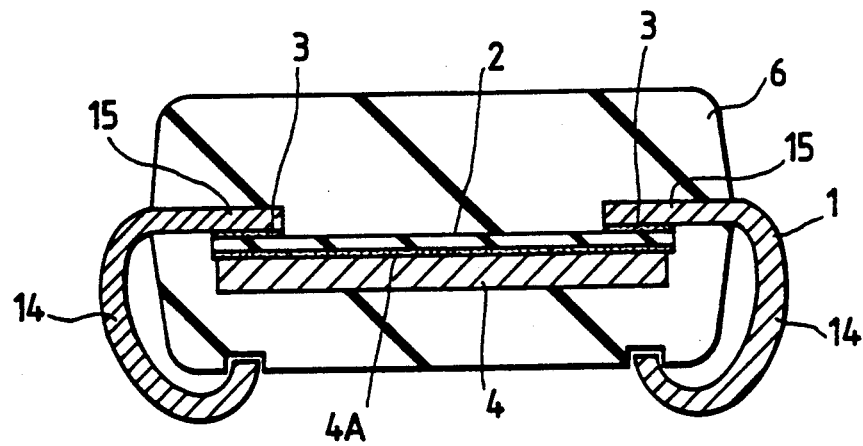
FIG. 2 is a sectional view of the 4MDRAM shown in FIG. 1 as taken along line II—II.
Figure 3:
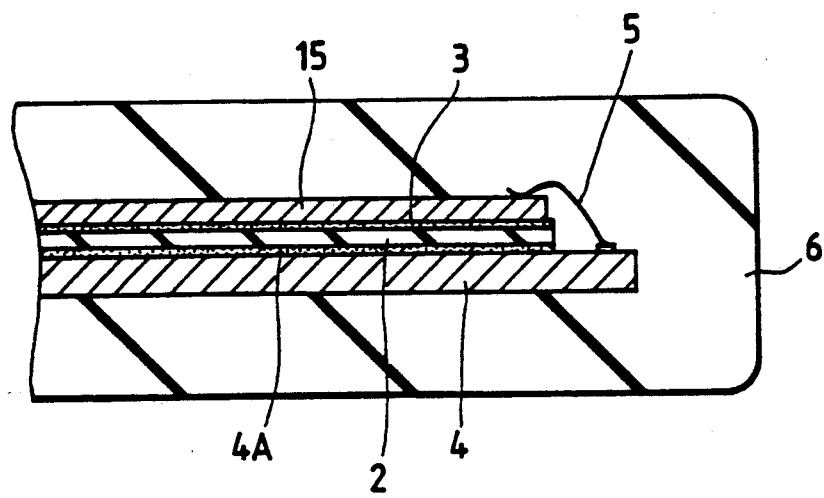
FIG. 3 is a sectional view of the 4MDRAM shown in FIG. 1 as taken along line III—III.

As illustrated in FIGS. 1-3, the resin-encapsulated semiconductor device of this embodiment in which the semiconductor chip of a 4MDRAM is mounted is such that an insulator film 2 is bonded with an adhesive 3 onto the inner lead portions 15 of a lead frame 1, which does not have tabs, in a reversed state, that the semiconductor chip 4 of the 4MDRAM is pellet-fixed onto the insulator film 2 by a pellet fixing thermosetting adhesive 4A with its principal surface side set as a bonding surface, and that the resultant structure is reversed, whereupon the inner lead portions 15 and the semiconductor chip 4 are electrically connected by pieces of bonding wire 5. Thus, the inner lead portions 15 of the lead frame 1, which does not have tabs, are arranged on the principal surface of the semiconductor chip 4 of the 4MDRAM through the insulator film 2. After the structure in this state is encapsulated with a resin sealant 6, the outer lead portions 14 of the lead frame 1 are worked into a predetermined shape. As to the size of the package of the device, the dimension of each shorter lateral side is 7.62 mm (300 mils), and that of each longer lateral side is 16.9 mm (675 mils).

As shown in FIG. 1, the lead frame 1 is formed of a thin flat plate (having a thickness of, for example, 0.25 mm) which is made of an iron-based (iron or its alloy) material such as 42 Alloy or Kovar or a copper-based (copper or its alloy) material such as phosphor bronze or tough-pitch copper.

Figure 4:
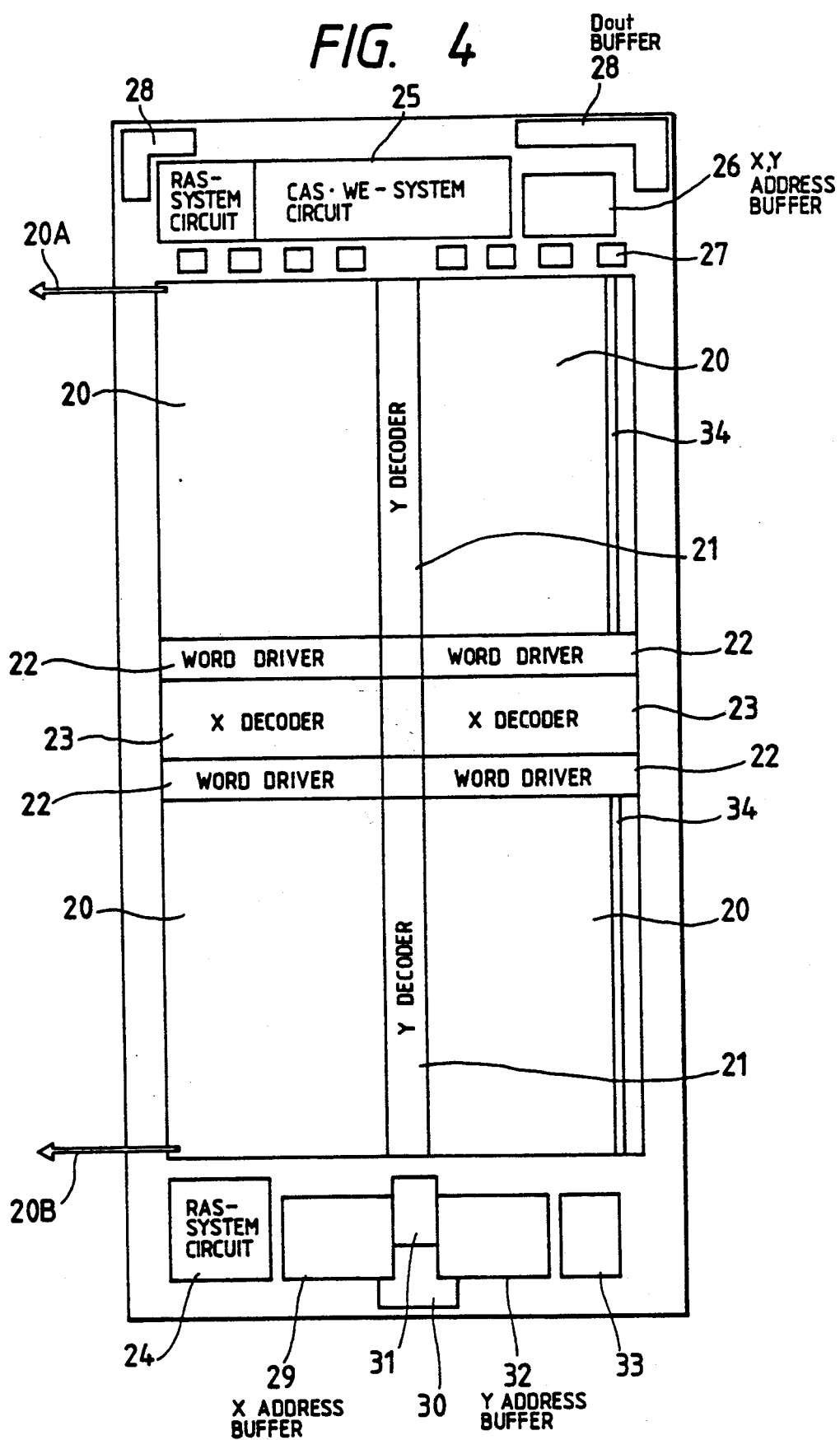
FIG. 4 is a plan view for explaining the layout of a semiconductor chip shown in FIG. 1.

The semiconductor chip 4 forms the 4MDRAM. As shown in FIG. 4, memory mats 20 are provided at the central part of this semiconductor chip, Y decoders 21 are provided at the X-directional central part thereof and in parallel with a Y-axis so as to extend along the memory mats 20, and word drivers 22 and X decoders 23 are provided at the Y-directional central part thereof and in parallel with an X-axis so as to extend along the memory mats 20.

In addition, at one end part of the semiconductor chip in the lengthwise direction thereof, a RAS-group circuit 24, a CAS-group/WE-group circuit 25 and an X/Y address buffer 26 are respectively provided, main amplifiers 27 are provided inside them, and $D_{out}$ buffers 28 are provided at the corners of the end part. At the other end part, there are provided a RAS-group circuit 24, an X address buffer 29, an X generator 30, an X/Y generator 31, a Y address buffer 32 and an SHR/PC generator 33. Additionally, sense amplifiers/common inputs and outputs/common sources 34 are provided at the right side end part of the semiconductor chip in the widthwise direction thereof, and the upper terminals 20A of the memory mats 20 are provided at the upper end of the left side end part thereof, while the lower terminals 20B of the memory mats 20 are provided at the lower end.

Figure 5:
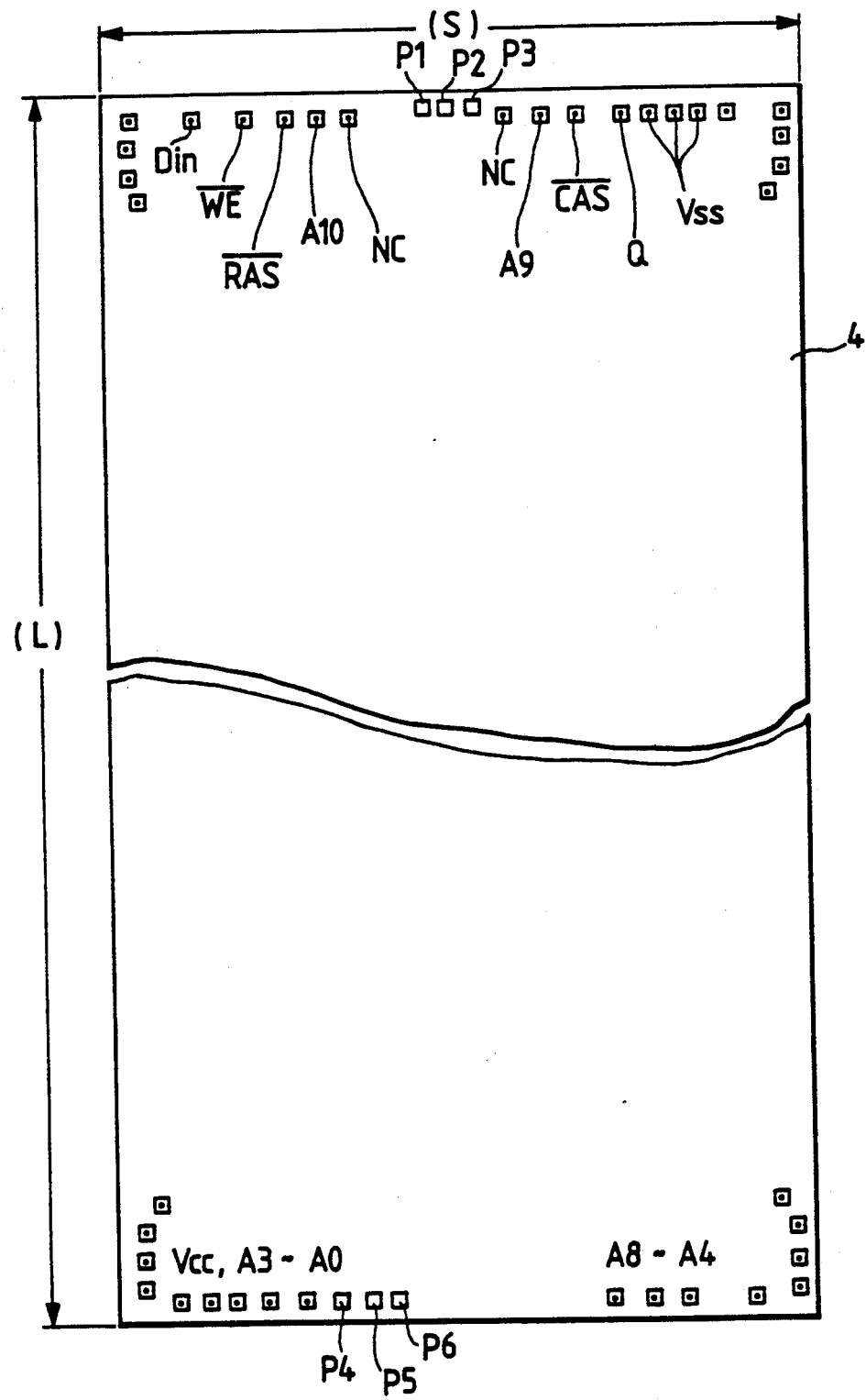
FIG. 5 is a plan view showing the arrangement of pads on the semiconductor chip shown in FIG. 1.

As shown in FIG. 5, the electrodes (pads) A0-A10, electrodes (pads) $D_{in}$, $\overline{WE}$, $\overline{RAS}$, NC, $V_{ss}$, $V_{cc}$, Q ($D_{out}$) and $\overline{CAS}$ and electrodes (pads) P1-P6 of various elements provided in the semiconductor chip 4 are arranged at both the end parts of the semiconductor chip 4 in the lengthwise direction thereof. The pads A0-A10 are for bonding signal lines, the pad $D_{in}$ is for a data input signal, the pad $\overline{WE}$ is for the $\overline{WE}$ circuit of the $\overline{CAS}$ group/$\overline{WE}$ group circuit 25, the pad $\overline{RAS}$ is for the $\overline{RAS}$ group circuit 24, the pad $V_{ss}$ is for a power source voltage $V_{ss}$, pads I/O1-I/O4 (refer to FIG. 1) are for the $D_{out}$ buffer 28, and the pad $\overline{CAS}$ is for the $\overline{CAS}$ group circuit of the $\overline{CAS}$ group/$\overline{WE}$ group circuit 25. Further, the pads P1-P6 are probing pads which are used in the tests of electrical characteristics.

As the size of the semiconductor chip 4, the dimension (S) of each of the shorter sides is 5.91 mm, and the dimension (L) of each longer side is 15.22 mm.

Figure 6:
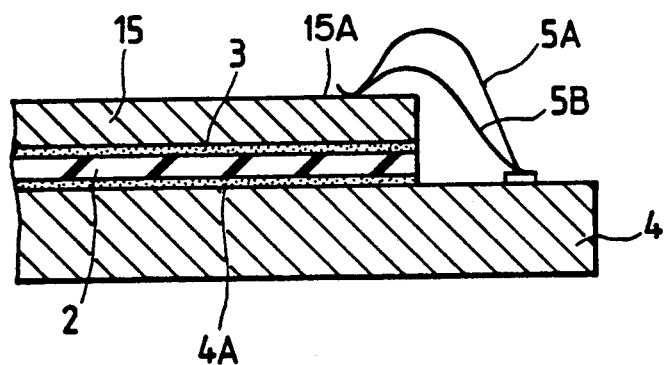
FIG. 6 is an expanded view of a cross wire bonding part shown in FIG. 1.

The corresponding inner leads are electrically connected to the respective pads by the bonding wire pieces 5. In this regard, as shown in FIG. 1 by way of example, a bonding wire piece 5A for electrically connecting the pad $\overline{RAS}$ and the inner lead $\overline{RAS}$ is laid so as to extend across a bonding wire piece 5B for electrically connecting the pad A9 and the inner lead A9. Here, as shown in FIG. 6, the bonding wire piece 5B has the loop height thereof made lower than that of the bonding wire piece 5A so as to prevent a short-circuit therebetween. Changing of the loop heights in this manner is utilized in the case of using one sort of semiconductor chip which is common for different packages. For example, in a case where a chip having heretofore been applied to a DIP (dual in-line package) is to be mounted on an SOJ (small out-line J-bend package), the pad arrangements of the packages are partly different, and hence, the wire loop heights need to be changed for effecting the cross wire bonding in order to connect some pads and the inner lead portions 15.

Now, a process for assembling the resin-encapsulated semiconductor device of this embodiment will be described.

Figure 7:
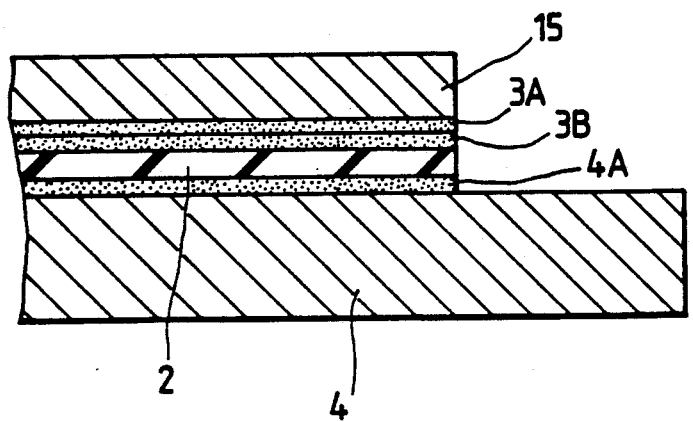
FIG. 7 is a view for explaining adhesives employed for arranging inner leads on the principal surface of the semiconductor chip shown in FIG. 1.

As seen from FIGS. 1 thru 3, first of all, the insulator film 2 made of a polyimide type resin is bonded with the adhesive 3 onto the inner lead portions 15 of the lead frame 1, which does not have tabs, in the reversed state. A polyimide type resin film having a thickness of 125 μm is used as the insulator film 2. Used as the adhesive 3 is, for example, a multilayer adhesive in which, as shown in FIG. 7, a thermoplastic binder 3A of polyether amide imide or the like and a thermosetting polyimide type resin binder 3B of polyimide pyromellite, polyketone imide or the like are stacked in this order from the side of the inner lead portions 15. The principal surface side of the semiconductor chip 4 is pellet-fixed onto the insulator film 2 by the pellet fixing thermosetting adhesive 4A. The pellet fixing thermosetting adhesive 4A consists of, for example, a multilayer adhesive in which a nonconductive paste material, e.g., silicone rubber, epoxy rubber, epoxy type resin or polyimide type resin is stacked on a thermosetting polyimide type resin binder of polyimide pyromellite, polyketone imide or the like.

Subsequently, the bonding terminal portion 15A of each inner lead portion 15 and the corresponding pad on the principal surface of the semiconductor chip 4 subjected to the pellet fixing operation are electrically connected by the piece of bonding wire 5. By way of example, gold (Au) wire having a diameter of 30 μm is used as the bonding wire 5. Regarding the wire bonding, by way of example, the bonding wire piece 5 and each of the pads A0-A10 on the semiconductor chip 4 are connected by wedge ball bonding. Likewise, the bonding wire piece 5 and the bonding terminal portion 15A of the inner lead portion 15 are connected (joined) by thermocompression employing ultrasonic vibrations. That part of the bonding terminal portion 15A of the inner lead portion 15 which is to be bonded is plated with silver (Ag). In electrically connecting the semiconductor chip 4 and the inner lead portions 15 by the use of the bonding wire pieces 5, the bonding positions (2 points) of the pads on the side of the semiconductor chip 4 are recognized for the purpose of determining coordinates, whereupon the wire bonding is automatically carried out.

When the wire bonding has ended, the injection port of the cavity of a resin sealant injection apparatus and the gate position 16 of the lead frame 1, which does not have a tab, are positioned, and thereafter, the resin sealant 6 such as epoxy type resin is poured into the cavity and then molded. The outer lead portions 14 are thereafter worked into the predetermined shape. Thus, the resin-encapsulated semiconductor device is now completed.

Now, the lead frame 1 will be described.

The lead frames 1 are juxtaposed in a unidirectional array to form a multiple lead frame though not shown. The multiple lead frame is unitarily formed in such a way that the single sheet of the lead frame material mentioned before is subjected to a proper expedient such as punching press work or etching process for providing individual lead frame portions. As shown in FIG. 1, each of the lead frames 1 is so shaped that the leads thereof enter from the longer lateral sides of the oblong package and extend to the shorter sides thereof. In particular, the leads (pins $V_{ss}$, A4, $V_{cc}$ and I/O1) entering from the four corners of the package enter from substantially the same relative positions and which positions are in line with the positions of the shorter lateral sides associated therewith of the semiconductor chip 4, and the corresponding inner leads extend toward the center of the semiconductor chip 4 and further to positions near the corresponding bonding pads arranged on the shorter lateral sides of the semiconductor chip 4.

In addition, since the leads which are more centrally disposed on the chip 4 also have longer lengths which extend within the package, they are more liable to come off because poor adhesion thereof with the sealing resin. In order to prevent such a drawback, the leads are formed with lugs 40 at those positions of the inner leads which are comparatively close to the side surfaces of the chip 4.

As understood from the above description, according to this embodiment, the inner lead portions 15 of the lead frame 1, which does not have tabs, are arranged on the principal surface of the semiconductor chip 4 through the insulator film 2, whereby a space for arranging the inner lead portions 15 around the semiconductor chip 4 as in the prior art is dispensed with, and the semiconductor chip 4 which is larger to that extent can be mounted.

In addition, owing to the arrangement of the inner lead portions 15 of the lead frame 1 on the principal surface of the semiconductor chip 4, the inner lead portions 15 can be utilized as a wiring layer. That is, it is possible to execute the operation of wire bonding from the desired positions of the semiconductor chip 4 to the inner lead portions 15. This signifies that, when the inner lead portions 15 are considered as the wiring layer and the insulator film 2 as an inter-layer insulator film which is provided with through holes (contacts), wiring can be laid from any places location.

All the inner leads and the pads are, furthermore, subjected to the wire bonding on the principal surface of the semiconductor chip 4, whereby short-circuiting (area shorting) between the end parts of the semiconductor chip 4 and the pieces of bonding wire 5 is basically avoided, and the wiring is facilitated. More specifically, since merely the insulator film 2 and the inner leads 15, which pose no problem even when contact exists on the semiconductor chip 4, attention may be paid only to the short-circuiting between the bonding wire pieces 5. Accordingly, the cross wire bonding is also permitted by adjusting only the loop heights of the bonding wire pieces 5. Thus, even a package of different sort such as an SOJ package, to which a different semiconductor chip 4 has been inevitably applied, can be manufactured using the common semiconductor chip 4 and by performing the cross wire bonding.

The bonding wire pieces 5, additionally can be made low and short and can also be readily bonded in parallel with the flowing direction of the sealing resin material 6 in the encapsulating operation thereof, so that the deformations of the bonding wire pieces 5 can be relieved.

In addition, the arrangement of the pads of the semiconductor chip 4 can have its versatility sharply increased as compared with the same in the prior art.

Moreover, since the insulating film made of the polyimide resin is stuck on the principal surface of the semiconductor chip 4, soft errors ascribable to alpha particles can be prevented without requiring a separate step of chip coating. That is, the number of steps required is reduced.

What is claimed is:

1. A semiconductor device comprising;
    a semiconductor chip having the shape of an elongated rectangle and having a principal surface which is formed with circuits and external terminals;
    an insulator sheet which is bonded on the principal surface of said semiconductor chip;
    a plurality of leads which are disposed on said insulator sheet and which are above said principal surface of said semiconductor chip, each one of said plurality of leads including an inner lead portion and an outer lead portion, each of said inner lead portions having a front end, and a part of each of said inner lead portions which is provided above said principal surface of said semiconductor chip having a width smaller than the width of said outer lead portions;
    pieces of metallic fine wire which electrically connect said external terminals and the front ends of said inner lead portions; and
    a sealing member which encapsulates said semiconductor chip, said insulator sheet, said inner lead portions and the metallic fine wire pieces;
    wherein said external terminals are arranged on the shorter sides of said rectangular shaped semiconductor chip, and the front ends of said inner lead portions are disposed near the corresponding external terminals which are to be connected thereto.

2. A semiconductor device according to claim 1, wherein said insulator sheet is made of a polyimide type resin.

3. A semiconductor device according to claim 1, wherein the metallic fine wire is gold wire.

4. A semiconductor device comprising:
    a semiconductor chip having the shape of an elongated rectangle and having a principal surface which is formed with circuits and external terminals;
    an insulator sheet which is bonded on the principal surface of said semiconductor chip;

a plurality of leads which are disposed on said insulator sheet and which are above said principal surface of said semiconductor chip, each one of said plurality of leads including an inner lead portion and an outer lead portion, each of said inner lead portions having a front end, and a part of each of said inner lead portions which is provided above said principal surface of said semiconductor chip having a width smaller than the width of said outer lead portions;

pieces of metallic fine wire which electrically connect said external terminals and the front ends of said inner lead portions;

a first adhesive layer which bonds said semiconductor chip and said insulator sheet;

a second adhesive layer which bonds said insulator sheet and said inner lead portions; and a sealing member which encapsulates said semiconductor chip, the first and second adhesive layers, said insulator sheet, said inner lead portions and the metallic fine wire pieces;

wherein said external terminals are arranged on the shorter sides of said rectangular shaped semiconductor chip, and the front ends of said inner lead portions are disposed near the corresponding external terminals which are to be connected thereto.

5. A semiconductor device according to claim 4, wherein said insulator sheet is made of a polyimide type resin.

6. A semiconductor device according to claim 4, wherein the metallic fine wire is gold wire.

7. A semiconductor device according to claim 4, wherein said first adhesive layer is made of a multiple adhesive layer in which thermosetting polyimide type resins are stacked.

8. A semiconductor device according to claim 7, wherein said multiple adhesive layer is formed of polyimide pyromellite and polyketone imide.

9. A semiconductor device according to claim 4, wherein said second adhesive layer is made of a thermoplastic resin.

10. A semiconductor device according to claim 9, wherein said thermoplastic resin is polyether amide imide.

11. A semiconductor device according to claim 5, wherein said first adhesive layer is a thermosetting adhesive.

12. A semiconductor device according to claim 11, wherein said thermosetting adhesive is a multiple adhesive layer including a layer of a nonconductive paste material and a layer of a thermosetting polyimide type resin of one of a polyimide pyromellite and polyketone imide.

13. A semiconductor device according to claim 12, wherein said nonconductive paste material is a polyimide type resin.

14. A semiconductor device according to claim 12, wherein said nonconductive paste material is one of silicone rubber, epoxy rubber, epoxy type resin and polyimide type resin.

15. A semiconductor device according to claim 14, wherein said second adhesive layer is a multiple adhesive layer.

16. A semiconductor device according to claim 14, wherein said second adhesive layer is a multiple adhesive layer comprised of a thermoplastic resin and a thermosetting resin.

17. A semiconductor device according to claim 14, wherein said second adhesive layer is a multiple adhesive layer comprised of a layer of a thermoplastic resin of polyether amide imide and a layer of a thermosetting polyimide type resin including one of polyimide pyromellite and polyketone imide.

18. A semiconductor device according to claim 13, wherein said second adhesive layer is a multiple adhesive layer.

19. A semiconductor device according to claim 13, wherein said second adhesive layer is a multiple adhesive layer comprised of a layer of a thermoplastic resin of polyether amide imide and a layer of a thermosetting polyimide type resin including one of polyimide pyromellite and polyketone imide.

20. A semiconductor device comprising:
a semiconductor chip having the shape of an elongated rectangle and having a principal surface which is formed with circuits and external terminals;

an insulator sheet which is bonded on the principal surface of said semiconductor chip;

a plurality of leads which are disposed on said insulator sheet and which are above said principal surface of said semiconductor chip, each one of said plurality of leads including an inner lead portion, which overlies the principal surface of said semiconductor chip and which is separated therefrom by said insulator sheet, and an outer lead portion, and each of said inner lead portions having a front end;

pieces of metallic fine wire which electrically connect said external terminals and the front ends of said inner lead portions; and a sealing member which encapsulates said semiconductor chip, said insulator sheet, said inner lead portions and said metallic fine wire pieces;

wherein said external terminals are arranged on the shorter sides of said rectangular shaped semiconductor chip near the edge thereof, and the front ends of said inner lead portions are disposed near the corresponding external terminals which are to be connected thereto.

21. A semiconductor device according to claim 20, wherein said inner lead portions which overlie said principal surface having smaller widths than said outer lead portions.

22. A semiconductor device according to claim 21, wherein said inner lead portions have front end edges facing the corresponding shorter sides of the rectangular shaped semiconductor chip, and wherein said front end edges are formed so as to entirely overlie said semiconductor chip.

23. A semiconductor device according to claim 22, wherein the front end edges of said inner lead portions are aligned so that all of said front end edges are distanced substantially equally from the corresponding short side edge of the rectangular shaped semiconductor chip.

24. A semiconductor device according to claim 23, wherein said outer lead portions are disposed along the respective larger sides of the rectangular shaped semiconductor chip.

25. A semiconductor device according to claim 24, wherein said external terminals are pads distributed along both of the shorter sides of the semiconductor chip and near the edges of the shorter sides thereof.

26. A semiconductor device according to claim 25, wherein said insulator sheet is made of a polyimide type resin.

27. A semiconductor device according to claim 1, wherein said inner lead portions have front end edges facing the corresponding shorter sides of the rectangular shaped semiconductor chip, and wherein said front end edges are formed so as to entirely overlie said semiconductor chip.

28. A semiconductor device according to claim 27, wherein the front end edges of said inner lead portions are aligned so that all of said front end edges are distanced substantially equally from the corresponding short side edge of the rectangular shaped semiconductor chip.

29. A semiconductor device according to claim 28, wherein said outer lead portions are disposed along the respective larger sides of the rectangular shaped semiconductor chip.

30. A semiconductor device according to claim 29, wherein said external terminals are pads distributed along both of the shorter sides of the semiconductor chip and near the edges of the shorter sides thereof.

31. A semiconductor device comprising:
a semiconductor chip having the shape of an elongated rectangle and having a principal surface which is formed with circuits and external terminals;
an insulator sheet which is bonded on the principal surface of said semiconductor chip;
a plurality of leads which are disposed on said insulator sheet and which are above said principal surface of said semiconductor chip, each one of said plurality of leads including an inner lead portion, which overlies the principal surface of said semiconductor chip and which is separated therefrom by said insulator sheet, and an outer lead portion, and each of said inner lead portions having a front end;
pieces of metallic fine wire which electrically connect said external terminals and the front ends of said inner lead portions;
a first adhesive layer which bonds said semiconductor chip and said insulator sheet;
a second adhesive layer which bonds said insulator sheet and said inner lead portions; and
a sealing member which encapsulates said semiconductor chip, said insulator sheet, said inner lead portions and said metallic fine wire pieces;
wherein said external terminals are arranged on the shorter sides of said rectangular shaped semiconductor chip near the edge thereof, and the front ends of said inner lead portions are disposed near the corresponding external terminals which are to be connected thereto.

32. A semiconductor device according to claim 31, wherein said inner lead portions have front end edges facing the corresponding shorter sides of the rectangular shaped semiconductor chip, and wherein said front end edges are formed entirely on said semiconductor chip through said insulator sheet.

33. A semiconductor device according to claim 32, wherein the front end edges of said inner lead portions are aligned so that all of said front end edges are distanced substantially equally from the corresponding short side edge of the rectangular shaped semiconductor chip.

34. A semiconductor device according to claim 33, wherein said outer lead portions are disposed along the respective larger sides of the rectangular shaped semiconductor chip.

35. A semiconductor device according to claim 34, wherein said external terminals are pads distributed along both of the shorter sides of the semiconductor chip and near the edges of the shorter sides thereof.

36. A semiconductor device according to claim 35, wherein said insulator sheet is made of a polyimide type resin.

37. A semiconductor device according to claim 36, wherein said first adhesive layer is a multiple adhesive layer including a layer of a nonconductive paste material and a layer of a thermosetting polyimide type resin of one of a polyimide pyromellite and polyketone imide.

38. A semiconductor device according to claim 37, wherein said nonconductive paste material is a polyimide type resin.

39. A semiconductor device according to claim 37, wherein said nonconductive paste material is one of silicone rubber, epoxy rubber, epoxy type resin and polyimide type resin.

40. A semiconductor device according to claim 37, wherein said second adhesive layer is a multiple adhesive layer.

41. A semiconductor device according to claim 37, wherein said second adhesive layer is a multiple adhesive layer comprised of a thermoplastic resin and a thermosetting resin.

42. A semiconductor device according to claim 39, wherein said second adhesive layer is a multiple adhesive layer comprised of a layer of a thermoplastic resin of polyether amide imide and a layer of a thermosetting polyimide type resin of one of polyimide pyromellite and polyketone imide.

43. A semiconductor device according to claim 42, wherein said inner lead portions which overlie said principal surface have smaller widths than said outer lead portions.

44. A semiconductor device according to claim 36, wherein said inner lead portions which overlie said principal surface have smaller widths than said outer lead portions.

45. A semiconductor device according to claim 30, wherein said insulator sheet is made of a polyimide type resin.

* * * * *